United States Patent [19]

Takemae

[11] Patent Number: 4,760,281
[45] Date of Patent: Jul. 26, 1988

[54] CLOCK SIGNAL GENERATING CIRCUIT

[75] Inventor: Yoshihiro Takemae, Tokyo, Japan

[73] Assignee: Fujitsu Limited, Kanagawa, Japan

[21] Appl. No.: 11,947

[22] Filed: Feb. 6, 1987

[30] Foreign Application Priority Data

Feb. 8, 1986 [JP] Japan .................. 61-024955

[51] Int. Cl.$^4$ .................. H03K 19/096; H03K 19/01
[52] U.S. Cl. .................. 307/269; 307/582; 307/480; 328/63
[58] Field of Search .................. 307/269, 480, 582; 328/63, 109

[56] References Cited

U.S. PATENT DOCUMENTS

| | | | |
|---|---|---|---|
| 4,352,996 | 10/1982 | White, Jr. .................. | 307/269 |
| 4,496,851 | 1/1985 | Southerland, Jr. .................. | 307/269 |
| 4,496,852 | 1/1985 | Blaser et al. .................. | 307/269 |
| 4,521,701 | 6/1985 | Reddy .................. | 307/482 |
| 4,542,307 | 9/1985 | Baba .................. | 307/482 |
| 4,574,203 | 3/1986 | Baba .................. | 307/269 |
| 4,633,105 | 12/1986 | Tsujimoto .................. | 307/482 |
| 4,636,657 | 1/1987 | Reddy .................. | 307/269 |

Primary Examiner—Stanley D. Miller
Assistant Examiner—Richard Roseen
Attorney, Agent, or Firm—Armstrong, Nikaido, Marmelstein & Kubovcik

[57] ABSTRACT

In a clock signal generating circuit for a semiconductor large scale integrated circuit, the clock signal generating circuit includes: a P-channel transistor and a first N-channel transistor, each connected in series between a positive side power source line and a ground side power source line; a second N-channel transistor connected between a common connection point of the P-channel transistor and the first N-channel transistor and a gate of the first N-channel transistor through a node, and a clock signal is applied to a gate of the second N-channel transistor. A capacitor is connected between the gate of the first N-channel transistor and a gate of the P-channel transistor; and a bootstrap capacitor is connected to the common connection point.

2 Claims, 6 Drawing Sheets

4,760,281

CLOCK SIGNAL GENERATING CIRCUIT

BACKGROUND OF THE INVENTION

1. Field of the Invention

The present invention relates to a clock signal generating circuit for a semiconductor large scale integrated circuit.

2. Description of the Related Art

In the field of the semiconductor large scale integrated (LSI) circuit, the clock signal generating circuit (below, clock generator) is widely used for synchronous operations among a central processing unit, memories and interface units. Accordingly, it is necessary to generate clock signals having a precise timing from the clock generator in order to carry out these synchronous operations. Moreover, the operating speed of these units depends on the clock rate (i.e., clock generating speed from the clock generator). Particularly, the logic operations of the LSI circuit greatly depend on this clock rate.

Therefore, it is necessary to realize extremely precise, high speed, and highly reliable clock signals for synchronous operations in the LSI circuit.

SUMMARY OF THE INVENTION

The object of the present invention is to provide a clock signal generating circuit enabling the generation of extremely precise, high speed, and highly reliable clock signals.

In accordance with the present invention, there is provided a clock signal generating circuit for a semiconductor large scale integrated circuit including: a P-channel transistor and a first N-channel transistor, each connected in series between a positive side power source line and a ground side power source line; a second N-channel transistor connected between a common connection point of the P-channel transistor and the first N-channel transistor and a gate of the first N-channel transistor through a node, a clock signal being applied to a gate of the second N-channel transistor; a capacitor connected between the gate of the first N-channel transistor and a gate of the P-channel transistor; and a bootstrap capacitor connected to the common connection point. Moreover, there is provided a clock signal generating circuit for a semiconductor large scale integrated circuit comprising: a P-channel transistor and a first N-channel transistor, each connected in series between a positive side power source line and a second node, and each having a complementary relationship; a second N-channel transistor connected between the second node and a ground side power source line; a third N-channel transistor connected between the second node and a gate of the second N-channel transistor through a first node; a capacitor connected to the first node; and a bootstrap capacitor connected to the second node.

DESCRIPTION OF THE PREFERRED EMBODIMENTS

Before describing the preferred embodiments, an explanation will be given of a conventional clock signal generating circuit.

Figure 1:
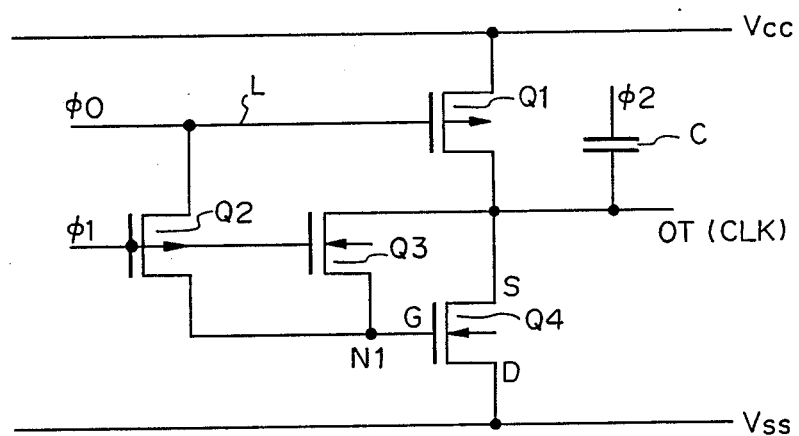
FIG. 1 is a circuit diagram of a conventional clock signal generating circuit.

Referring to FIG. 1, Q1 to Q4 denote MOS transistors, C a bootstrap capacitor, $\phi 0$ to $\phi 2$ input clock signals, OT an output terminal, N1 a node, $V_{cc}$ a voltage level of a positive side power source line, and $V_{ss}$ a voltage level of a ground side power source line.

The operations of this circuit will be explained in detail with reference to FIG. 2.

Figure 2:
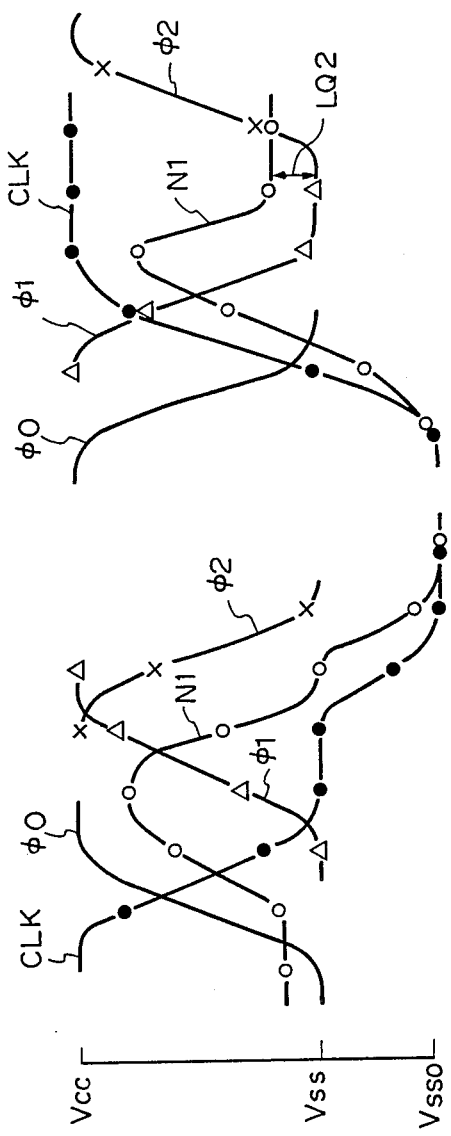
FIG. 2 is a signal timing chart of the circuit shown in FIG. 1.

In FIG. 2, the left side denotes an active state and the right side denotes a reset state. The clock signal CLK is obtained by alternately repeating these two states. The clock signal CLK is also obtained from the output terminal OT, and is indicated by black dots.

The clock signal CLK is pulled down from the $V_{cc}$ level to the $V_{ss0}$ lower than the $V_{ss}$ level by a bootstrap effect of the capacitor C in the active state and pulled up from the $V_{ss0}$ level to the $V_{cc}$ level in the reset state. In order to obtain these curves, first, when the clock signal $\phi 0$ applied to the gate of the transistor Q1 is pulled up from the $V_{ss}$ level to the $V_{cc}$ level, the P-channel transistor Q1 is turned OFF. Accordingly, the level of the output terminal OT is held to the $V_{cc}$ level.

At this time, the clock signal $\phi 1$ applied to the gate of the transistor Q2 is set to the $V_{ss}$ level, and thus the P-channel transistor Q2 is held in the ON state. Accordingly, the node N1 is charged up through the transistor Q2 so as to approach the $V_{cc}$ level.

When the node N1 approaches the $V_{cc}$ level, the level of the output terminal OT reaches the $V_{ss}$ level, since the N-channel transistor Q4 is turned ON. Next, when the clock signal $\phi 1$ is pulled up from the $V_{ss}$ level to the $V_{cc}$ level, the P-channel transistor Q2 is turned OFF and the N-channel transistor Q3 is turned ON. Accordingly, the charge of the node N1 is discharged through the transistor Q3 to the output terminal OT. Thus, the level of the node N1 is pulled down to the $V_{ss}$ level, and then the N-channel transistor Q4 is turned OFF.

In these states, when the clock signal $\phi 2$ is pulled down from the $V_{cc}$ level to the $V_{ss}$ level, the level of the output terminal OT is pulled down to the $V_{ss0}$ level lower than the $V_{ss}$ level. This rapid pulling down of the output level depends on the so-called bootstrap effect achieved by the bootstrap capacitor C.

That is, when the node N1 is at the $V_{ss}$ level, the charges flow from the $V_{ss}$ side to the output terminal OT when the level of the output terminal OT is pulled down to the $V_{ss}-V_{th}$ level. Accordingly, the level of the output terminal OT can not be pulled down lower than the above level. In this case, since the N-channel transistor Q3 is turned ON and the node N1 is connected to the output terminal OT, the level of the node N1 can be simultaneously pulled down and the transistor Q4 is held in the OFF state. Accordingly, the level of the output terminal OT can be pulled down to the $V_{ss0}$ level lower than the $V_{ss}$ level of the ground side power source line. This phenomenon is known as the bootstrap effect.

When the node N1 is at the $V_{ss}$ level, the level of the output terminal OT is pulled down to the $V_{ss}-V_{th}$ and the charges flow from the $V_{ss}$ side as explained above. This phenomenon will be explained in more detail below. That is, when the node N1 is the $V_{ss}$ level, the output side of the transistor Q4 becomes a source and the ground side thereof becomes a drain, when the output terminal OT is pulled down lower than the $V_{ss}$ level. When the source side of the transistor Q4 becomes $V_{ss}-V_{th}$, the potential difference between the source and the drain becomes higher than $V_{th}$. Accordingly, the charges (current) flow from the ground side to the output terminal side. In this case, although the level of the output terminal OT is not pulled down lower than the level of $V_{ss}-V_{th}$, in actual practice, the level of the output terminal OT is pulled down to the $V_{ss0}$ level since the transistor Q3 is turned ON and the transistor Q4 is turned OFF. As a result, the bootstrap effect is realized in the output terminal OT.

In the reset state, when the clock signal $\phi 0$ is pulled down from the $V_{cc}$ level to the $V_{ss}$ level, the P-channel transistor Q1 is turned ON and the clock signal CLK is pulled up to the $V_{cc}$ level. At this time, since the clock signal $\phi 1$ is held at the $V_{cc}$ level, the transistor Q2 is held in the OFF state and the transistor Q3 is held in the ON state. Accordingly, the node N1 is charged up through the transistor Q3 so as to approach the $V_{cc}$ level.

Next, when the clock signal $\phi 1$ is also pulled down from the $V_{cc}$ level to the $V_{ss}$ level, the transistor Q3 is turned OFF and the transistor Q2 is turned ON. Accordingly, the charge of the node N1 is discharged to the signal line L of the clock signal $\phi 0$ through the transistor Q2 and the level of the node N1 is pulled down so as to approach the $V_{ss}$ level. Thus, the N-channel transistor Q4 is turned OFF.

There is, however, a problem in the reset state. That is, when the transistor Q2 is turned ON, the charge of the node N1 is discharged to the signal line L. Accordingly, the level of the node N1 is pulled down to nearly the level of the $V_{ss}$ level as shown in FIG. 2. The difference between this level and the $V_{ss}$ level is shown by "LQ2" in FIG. 2. The difference LQ2 is caused by a threshold level $V_{th}$ of the transistor Q2.

Accordingly, assuming that the threshold level of the P-channel transistor Q2 is higher than that of the N-channel transistor Q4, the level of the node N1 cannot be pulled down to a sufficiently low level (i.e., $V_{ss}$ level), and thus the N-channel transistor can not be completely turned OFF.

Consequently, it is difficult to obtain an extremely precise, high speed, and highly reliable clock signal CLK in the conventional clock generator.

A clock signal generating circuit according to the present invention will be explained in detail hereinafter.

Figure 3:
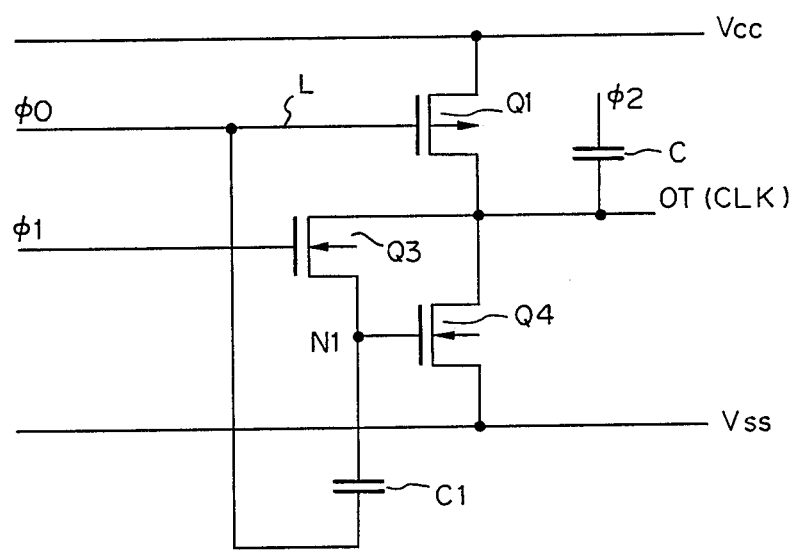
FIG. 3 is a circuit diagram of a clock signal generating circuit according to an embodiment of the present invention.

Referring to FIG. 3, the same reference numbers are attached to the same components as that of the circuit shown in FIG. 1. In this embodiment, the P-channel transistor Q2 is omitted and a capacitor C1 is added between the node N1 and the signal line L.

The operations of this circuit will be explained in detail with reference to FIG. 4.

Figure 4:
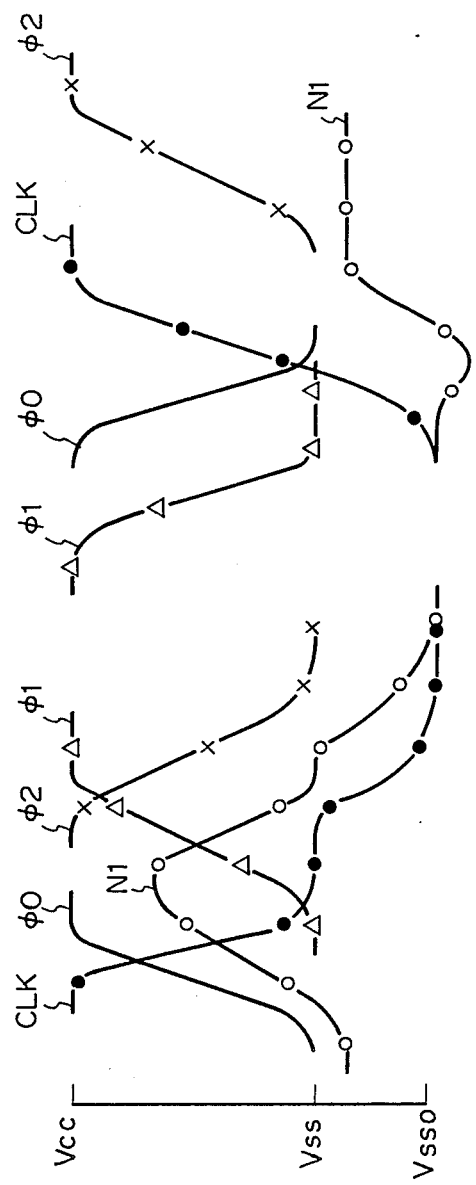
FIG. 4 is a signal timing chart of the circuit shown in FIG. 3.

In FIG. 4, when the clock signal $\phi 0$ applied to the gate of the transistor Q1 is pulled up from the $V_{ss}$ level to the $V_{cc}$ level, the P-channel transistor Q1 is turned OFF and the level of the output terminal OT (clock signal CLK is output) is held to the $V_{cc}$ level. At this time, the level of the node N1 is pulled up by the capacitor C1 so as to approach the $V_{cc}$ level.

When the level of the node N1 is pulled up, the level of the clock signal CLK is pulled down to the $V_{ss}$ level since the first N-channel transistor Q4 is turned ON. Next, when the clock signal $\phi 1$ applied to the gate of the transistor Q3 is pulled up from the $V_{ss}$ level to the $V_{cc}$ level, the second N-channel transistor Q3 is turned ON. Accordingly, the charge of the node N1 is discharged through the transistor Q3 to the output terminal OT, then, the node N1 is pulled down to the $V_{ss}$ level, and thus the N-channel transistor Q4 is turned OFF.

In these states, when the clock signal $\phi 2$ applied to the bootstrap capacitor C is pulled down from the $V_{cc}$ level to the $V_{ss}$ level, the level of the clock signal CLK is pulled down to the $V_{ss0}$ level lower than the $V_{ss}$ level by the bootstrap effect of the capacitor C.

In the reset state, when the clock signal $\phi 1$ is pulled down from the $V_{cc}$ level to the $V_{ss}$ level, the N-channel transistor Q3 is turned OFF. When the clock signal $\phi 0$ is pulled down from the $V_{cc}$ level to the $V_{ss}$ level, the P-channel transistor Q1 is turned ON. Accordingly, the clock signal CLK is pulled up to the $V_{cc}$ level and the level of the node N1 is pulled down further.

As explained above, the N-channel transistor Q3 is turned OFF when the clock signal $\phi 1$ is pulled down from the $V_{cc}$ level to the $V_{ss}$ level. The clock signal CLK is pulled up from the $V_{ss0}$ level to the $V_{cc}$ level when the clock signal $\phi 0$ is pulled down from the $V_{cc}$ level to the $V_{ss}$ level. Accordingly, the node N1 is charged up through the transistor Q3. When the threshold level of the transistor Q3 is $V_{th}$, the level of the node N1 becomes $V_{ss}-V_{th}$. Consequently, it is possible for the transistor Q4 to completely turn OFF since the level of the node N1 is sufficiently pulled down. As explained in FIGS. 1 and 2, conventionally, the level of the node N1 becomes $V_{ss}+V_{th}$. Therefore, it is difficult for the transistor Q4 to completely turn OFF since the level of the node N1 can not be sufficiently pulled down.

Figure 5:
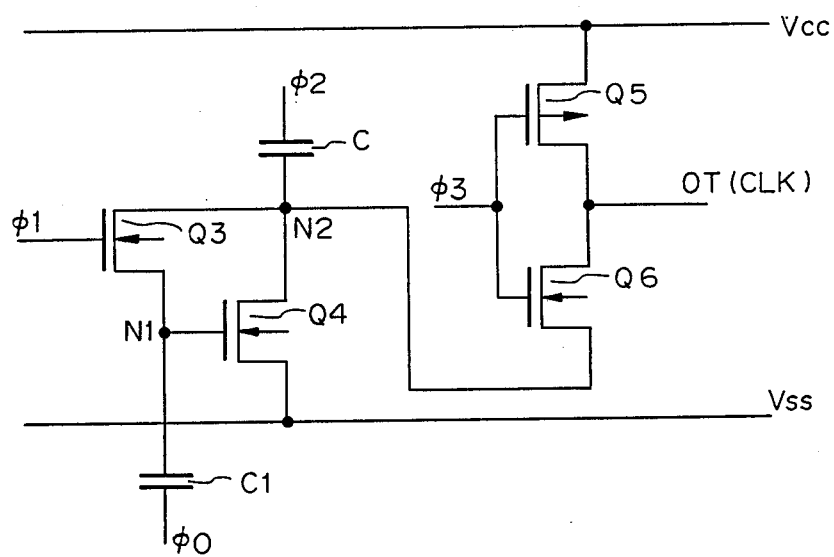
FIG. 5 is a circuit diagram of a clock signal generating circuit according to another embodiment of the present invention.
Figure 6:
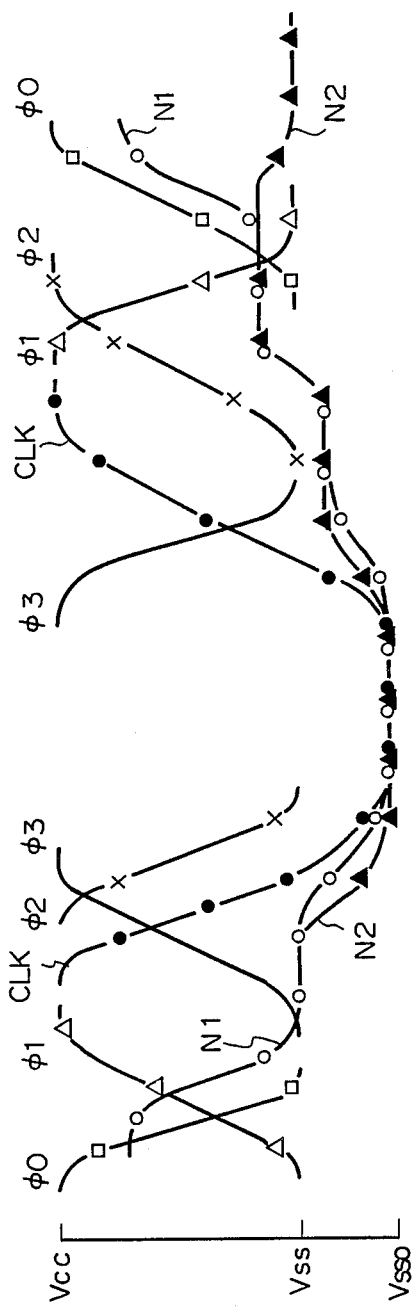
FIG. 6 is a signal timing chart of the circuit shown in FIG. 5.

Referring to FIG. 5, the P-channel transistor Q5 and the first N-channel transistor Q6 are newly added to the output stage. Accordingly, the output terminal OT is provided at the common connection point of both transistors Q5 and Q6. The clock signal $\phi 3$ is also newly applied to the common connection point of both gates of the transistors Q5 and Q6. Each of the transistors Q5 and Q6 is constituted by a complementary MOS transistor (CMOS transistor).

In the active state, when the clock signal $\phi 0$ is pulled down from the $V_{cc}$ level to the $V_{ss}$ level, the level of the first node N1 is pulled down from the near level of the $V_{cc}$ level to the $V_{ss}$ level and the second N-channel transistor Q4 is turned OFF. At this time, when the clock signal $\phi 1$ is pulled up from the $V_{ss}$ level to the $V_{cc}$ level, the third N-channel transistor Q3 is turned OFF, then, the node N1 is connected to the second node N2. In this state, when the clock signal $\phi 3$ is pulled up from the $V_{ss}$ level to the $V_{cc}$ level, the P-channel transistor Q5 is turned OFF and the N-channel transistor Q6 is turned ON, thus, the clock signal CLK is pulled down from the $V_{cc}$ level to the $V_{ss0}$ level. At this time, when the clock signal $\phi 2$ is pulled down from the $V_{cc}$ level to the $V_{ss}$ level, the level of the node N2 is pulled down lower than the $V_{ss}$ level by the bootstrap effect of the capacitor C. Since the node N2 is pulled down lower than the $V_{ss}$ level at the same time as the transistor Q6 is turned ON, the clock signal CLK is rapidly pulled down from the $V_{cc}$ level to the $V_{ss0}$ level lower than the $V_{ss}$ level by the bootstrap effect of the capacitor C.

In the reset state, when the clock signal $\phi 3$ is pulled down from the $V_{cc}$ level to the $V_{ss}$ level, the P-channel transistor Q5 is turned ON and the N-channel transistor Q6 is turned OFF. Accordingly, the level of the output terminal OT (clock signal CLK is output) is pulled up from the $V_{ss0}$ level to the $V_{cc}$ level. At this time, the charge of the node N2 is slightly discharged to the output terminal.

In this state, when the clock signal $\phi 2$ is pulled up from the $V_{ss}$ level to the $V_{cc}$ level, the levels of the nodes N1 and N2 and pulled up to $V_{ss}+V_{th}$ since the node N1 is connected to the node N2 through the transistor Q3. This value $V_{ss}+V_{th}$ is a limitation value at which the transistor Q4 is not turned ON. Next, when the clock signal $\phi 1$ is pulled down from the $V_{cc}$ level to the $V_{ss}$ level, the N-channel transistor Q3 is turned OFF. After this step, when the clock signal $\phi 0$ is pulled up from the $V_{ss}$ level to the $V_{cc}$ level, the level of the node N1 is pulled up and the N-channel transistor Q4 is turned OFF. Accordingly, the level of the node N2 is held at the $V_{ss}$ level.

In the specification, all of the clock signals $\phi 0$, $\phi 1$, $\phi 2$, and $\phi 3$ are generated from control means (not shown) in the LSI circuit, and since a conventional control means can be used, an explanation thereof will be omitted.

I claim:

1. A clock signal generating circuit for a semiconductor integrated circuit comprising:
   a P-channel transistor and a first N-channel transistor, each connected in series between a positive side power source line and a ground side power source line;
   a capacitor connected between a gate of said first N-channel transistor and a gate of said P-channel transistor, said gate of said P-channel transistor receiving a first clock signal input;
   a second N-channel transistor connected between a common connection point of said P-channel transistor and said first N-channel transistor and said gate of said first N-channel transistor, a node being positioned between said second N-channel transistor and the gate of said first N-channel transistor, and a second clock signal being applied to a gate of said second N-channel transistor;
   a bootstrap capacitor connected to said common connection point on one end thereof and receiving a third clock signal at another end thereof; and
   wherein said first clock signal is applied to said P-channel transistor to render said P-channel transistor non-conductive and said first N-channel transistor conductive, respectively, then said second clock signal is applied to said second N-channel transistor to render said second N-channel transistor conductive, and subsequently said third clock signal is applied to said bootstrap capacitor in order to pull down the potential of said common connection point.

2. A clock signal generating circuit for a semiconductor integrated circuit comprising:
   a P-channel transistor and a first N-channel transistor, each connected in series between a positive side power source line and a second node, and each having a complementary relationship;
   a second N-channel transistor connected between said second node and a ground side power source line;
   a third N-channel transistor connected between said second node and a gate of said second N-channel transistor a first node being positioned between said third N-channel transistor and said gate of said second N-channel transistor;
   a capacitor connected to said first node; and
   a bootstrap capacitor connected to said second node
   wherein, a first clock signal is provided to said capacitor, a second clock signal is provided to a gate of said third N-channel transistor, a third clock signal is provided to said bootstrap capacitor, and a fourth clock signal is provided to a common point between the gates of said P-channel transistor and said first N-channel transistor.

* * * * *